(12) United States Patent
Landru et al.

(10) Patent No.: US 9,198,294 B2
(45) Date of Patent: Nov. 24, 2015

(54) ELECTRONIC DEVICE FOR RADIOFREQUENCY OR POWER APPLICATIONS AND PROCESS FOR MANUFACTURING SUCH A DEVICE

(75) Inventors: Didier Landru, Champ Pres Froges (FR); Luciana Capello, Grenoble (FR); Eric Desbonnet, Lumbin (FR); Christophe Figuet, Crolles (FR); Oleg Kononchuk, Grenoble (FR)

(73) Assignee: SOITEC, Bernin (FR)

( * ) Notice: Subject to any disclaimer, the term of this patent is extended or adjusted under 35 U.S.C. 154(b) by 153 days.

(21) Appl. No.: 13/989,751

(22) PCT Filed: Nov. 16, 2011

(86) PCT No.: PCT/EP2011/070220
§ 371 (c)(1),
(2), (4) Date: May 24, 2013

(87) PCT Pub. No.: WO2012/066021
PCT Pub. Date: May 24, 2012

(65) Prior Publication Data
US 2013/0294038 A1 Nov. 7, 2013

(30) Foreign Application Priority Data
Nov. 19, 2010 (FR) ...................................... 10 59539

(51) Int. Cl.
*H05K 1/18* (2006.01)
*H01L 21/762* (2006.01)
(52) U.S. Cl.
CPC ............ *H05K 1/18* (2013.01); *H01L 21/76251* (2013.01); *H01L 21/76254* (2013.01)

(58) Field of Classification Search
CPC ............... H05K 1/18; H01L 21/76251; H01L 21/76254
USPC ......................................................... 438/455
See application file for complete search history.

(56) References Cited

U.S. PATENT DOCUMENTS 5,053,283 A * 10/1991 Brown .......................... 428/432
6,911,375 B2    6/2005 Guarini et al.
(Continued)

FOREIGN PATENT DOCUMENTS

FR       2781082 A1    1/2000
FR       2856193 A1   12/2004
(Continued)

OTHER PUBLICATIONS

International Search Report for International Application No. PCT/EP2011/070220 dated Mar. 28, 2012, 6 pages.
(Continued)

*Primary Examiner* — Timothy Thompson
*Assistant Examiner* — Charles Pizzuto
(74) *Attorney, Agent, or Firm* — TraskBritt

(57) ABSTRACT

The invention relates to an electronic device for radiofrequency or power applications, comprising a semiconductor layer supporting electronic components on a support substrate, wherein the support substrate comprises a base layer having a thermal conductivity of at least 30 W/mK and a superficial layer having a thickness of at least 5 μm, the superficial layer having an electrical resistivity of at least 3000 Ohm·cm and a thermal conductivity of at least 30 W/mK. The invention also relates to two processes for manufacturing such a device.

11 Claims, 4 Drawing Sheets

(56) References Cited

U.S. PATENT DOCUMENTS

| | | | |
|---|---|---|---|
| 6,944,375 B2 | 9/2005 | Sakata et al. | |
| 7,148,079 B1 * | 12/2006 | Raman et al. | 438/105 |
| 2002/0185685 A1 | 12/2002 | Ju et al. | |
| 2007/0001289 A1 | 1/2007 | Takao | |
| 2007/0032040 A1 | 2/2007 | Lederer | |
| 2009/0027519 A1 | 1/2009 | Nishiwaki et al. | |
| 2009/0278233 A1 * | 11/2009 | Pinnington et al. | 257/615 |
| 2009/0321873 A1 | 12/2009 | Nguyen et al. | |
| 2010/0072576 A1 * | 3/2010 | Arena | 257/615 |
| 2011/0076849 A1 * | 3/2011 | Blanchard | 438/689 |
| 2012/0164778 A1 * | 6/2012 | Blanchard et al. | 438/66 |
| 2013/0094865 A9 * | 4/2013 | Pinguet et al. | 398/164 |

FOREIGN PATENT DOCUMENTS

| | | |
|---|---|---|
| JP | 2002299263 A | 10/2002 |
| JP | 2006173204 A | 6/2006 |
| JP | 2007012897 A | 1/2007 |
| JP | 2009027604 A | 2/2009 |
| TW | M389354 | 9/2010 |
| WO | 9702598 A1 | 1/1997 |

OTHER PUBLICATIONS

International Written Opinion for International Application No. PCT/EP2011/070220 dated Mar. 28, 2012, 12 pages.

International Preliminary Report on Patentability for International Application No. PCT/EP2011/070220 dated May 21, 2013, 13 pages.

Jordan et al., Semi-insulating silicon for microwave devices, Solid State Phenomena vols. 156-158 (2010) pp. 101-106.

TW Office Action and Search Report for Taiwanese Patent Application No. 100141594 dated Dec. 1, 2014, 7 pages.

* cited by examiner

ELECTRONIC DEVICE FOR RADIOFREQUENCY OR POWER APPLICATIONS AND PROCESS FOR MANUFACTURING SUCH A DEVICE

CROSS-REFERENCE TO RELATED APPLICATIONS

This application is a national phase entry under 35 U.S.C. §371 of International Patent Application PCT/EP2011/070220, filed Nov. 16, 2011, designating the United States of America and published in English as International Patent Publication WO 2012/066021 A1 on May 24, 2012, which claims the benefit under Article 8 of the Patent Cooperation Treaty and under 35 U.S.C. §119(e) to French Patent Application Serial No. 1059539, filed Nov. 19, 2010, the disclosure of each of which is hereby incorporated herein by this reference in its entirety.

TECHNICAL FIELD

The present invention relates to an electronic device for radiofrequency or power applications, comprising a semiconductor layer supporting electronic components on a support substrate, and processes for manufacturing such a device.

BACKGROUND

The production of microelectronic devices, particularly for applications in the field of radiofrequency or power, requires the placing of components on a support substrate having a high electrical resistivity and good thermal conductivity.

Indeed, a high resistivity makes it possible to limit high-frequency interactions between transistors (the field line penetration in the substrate causing parasitic effects).

A good thermal conductivity is necessary to discharge the heat generated by high-frequency or high-power device operation.

According to a known solution, these devices may be produced on SOI (an acronym of the term "Silicon On Insulator") type substrates, wherein the silicon support substrate (or a part thereof) is highly resistive.

In this way, document US 2009/321873 describes a structure successively comprising a silicon support substrate, a layer of high-resistivity silicon, a layer of silicon oxide and a thin layer of silicon wherein the components are formed.

Document US 2007/032040 describes an SOI substrate comprising a silicon support substrate having an electrical resistivity greater than 3000 Ohm·cm, a layer of silicon oxide and a thin layer of silicon wherein the components are formed.

However, these substrates involve the drawback of having a low thermal conductivity, particularly due to the presence of a relatively thick layer of silicon oxide ($SiO_2$), which is a poor heat conductor.

The thermal conductivity of such SOI substrates, since the oxide thickness exceeds about 50 nm, may then be limited by the conductivity of this silicon oxide, of the order of 1 to 2 W/mK, which is insufficient for the intended applications.

According to a second known solution, the components may be produced on a first substrate, for example, a silicon substrate, and after the production thereof, the components may be transferred onto a final support substrate made of sapphire, which is a material having an electrical resistivity of the order of $10^{14}$ Ohm·cm.

Such an approach is presented, for example, in document U.S. Pat. No. 6,944,375.

However, sapphire has a thermal conductivity of 30 to 40 W/mK, which is considered to have scope for improvement for the intended applications.

An oxide layer is inserted between the layer supporting the components and the sapphire substrate to facilitate bonding.

However, as explained above, this oxide layer may form a thermal barrier preventing heat dissipation within the sapphire substrate.

Moreover, sapphire substrates are relatively costly, particularly for diameters larger than 150 mm.

One aim of the present invention is thus of providing a support substrate for a device for radiofrequency or power applications.

More specifically, this support substrate may have both a high electrical resistivity, i.e., greater than 3000 Ohm·cm, and a thermal conductivity at least equally as good as that of silicon (preferably greater than 30 W/mK), while being less costly than sapphire.

This substrate should be suitable for being manufactured to form large wafers, i.e., typically having a diameter greater than 150 mm.

This support substrate should also be suitable for the manufacturing process of the device and, particularly, have the required thermal properties (in particular, in terms of thermal expansion coefficient and temperature resistance) according to the process defined.

BRIEF SUMMARY

The invention relates to an electronic device for radiofrequency or power applications, comprising a semiconductor layer supporting electronic components on a support substrate, characterized in that the support substrate comprises a base layer having a thermal conductivity of at least 30 W/mK and a superficial layer having a thickness of at least 5 μm, the superficial layer having an electrical resistivity of at least 3000 Ohm·cm and a thermal conductivity of at least 30 W/mK.

The superficial layer is between the base layer and the semiconductor layer.

According to an embodiment of the invention, the support substrate is a bilayer substrate comprising a superficial layer of AlN, alumina or amorphous diamond-like carbon having a thickness greater than 5 μm on a silicon base substrate.

According to an embodiment of the invention, the support substrate is a silicon substrate comprising a porous surface region having a thickness greater than 5 μm.

According to an embodiment of the invention, the support substrate is an aluminium substrate encased with an AlN or alumina coating having a thickness greater than 5 μm.

According to an embodiment of the invention, the support substrate is a silicon substrate comprising a surface region doped with gold, with a concentration greater than $10^{15}$ at/$cm^3$ and having a thickness greater than 5 μm.

The layer supporting the components is preferably made of silicon, germanium or a group III-V alloy.

Optionally, a silicon oxide layer having a thickness of less than 50 nm is inserted between the support substrate and the layer supporting the components.

Alternatively, a layer of AlN, alumina, amorphous diamond-like carbon or high-resistivity polycrystalline silicon may be inserted between the support substrate and the layer supporting the components.

The device may be a wafer having a diameter greater than or equal to 150 mm.

Alternatively, the device may be a chip.

Another object of the invention is a process for manufacturing a device for radiofrequency or power applications, comprising a layer supporting electronic components on a support substrate, the process comprising the following successive steps:
- a) formation of a structure comprising a semiconductor layer on the support substrate,
- (b) manufacture of the components in the semiconductor layer,
- characterized in that in step (a), a support substrate comprising a base layer having a thermal conductivity of at least 30 W/mK and a superficial layer having a thickness of at least 5 µm, the superficial layer having an electrical resistivity of at least 3000 Ohm·cm and a thermal conductivity of at least 30 W/mK, is used.

According to an embodiment of the invention, the support substrate is a bilayer substrate comprising a layer of AlN, alumina or amorphous diamond-like carbon having a thickness greater than 5 µm on a silicon base substrate.

According to another embodiment, the support substrate is a silicon substrate comprising a porous surface region having a thickness greater than 5 p.m.

Another object of the invention is a process for manufacturing a device for radiofrequency or power applications, comprising a layer supporting electronic components on a support substrate, comprising the following successive steps:
- (a) manufacturing of the components in a semiconductor layer of a donor substrate,
- (b) bonding of the semiconductor layer supporting the components on an intermediate substrate,
- (c) removal of the remainder of the donor substrate to transfer the layer supporting the components onto the intermediate layer,
- (d) bonding of the layer supporting the components on the support substrate,
- (e) removal of the intermediate substrate,
- characterized in that, in step (d), a support substrate comprising a base layer having a thermal conductivity of at least 30 W/mK and a superficial layer having a thickness of at least 5 µM, the superficial layer having an electrical resistivity of at least 3000 Ohm·cm and a thermal conductivity of at least 30 W/mK, is used.

According to another embodiment of the invention, the support substrate is a bilayer substrate comprising a layer of AlN, alumina or amorphous diamond-like carbon having a thickness greater than 5 µm on a silicon base substrate.

According to an embodiment of the invention, the support substrate is a silicon substrate comprising a porous surface region having a thickness greater than 5 µm.

According to another embodiment of the invention, the support substrate is an aluminium substrate encased with an AlN or alumina coating having a thickness greater than 5 µm.

According to another embodiment, the support substrate is a silicon substrate comprising a surface region doped with gold, with a concentration greater than $10^{15}$ at/cm$^3$ and having a thickness greater than 5 µm.

Particularly preferably, the donor substrate successively comprises a first substrate, a silicon oxide layer having a thickness less than 50 nm and the semiconductor layer, and, during step (c), the silicon oxide layer is left on the layer supporting the components.

BRIEF DESCRIPTION OF THE FIGURES

Further features and advantages of the invention will emerge from the detailed description hereinafter, with reference to the appended figures wherein.

It is specified that to facilitate the illustration of the devices, the ratios of the thicknesses of the various layers have not necessarily been observed.

DETAILED DESCRIPTION

The device may be manufactured according to two main processes, described hereinafter with reference to FIGS. 1A to 1E and 4A to 4F, respectively.

First Process: Manufacture of Components in a Semiconductor Layer on the Support Substrate A first process generally consists of first manufacturing a structure comprising the support substrate and the thin semiconductor layer for receiving the components, and manufacturing the components in the semiconductor layer.

The techniques for manufacturing components involve high temperatures, i.e., typically greater than 1000° C.

Therefore, this means that the support substrate needs to be able to withstand such temperatures.

Moreover, the support substrate should have a thermal expansion coefficient at the temperature in question, which is of the same order as that of the material of the semiconductor layer supporting the components, to prevent stress generation in the structure during the manufacture thereof.

In this way, for a semiconductor layer supporting the components made of silicon, and a process for manufacturing the structure requiring exposure at 800° C., the thermal expansion coefficient of the support substrate is between 1 and $5 \times 10^{-6} \text{K}^{-1}$.

Figure 1A:
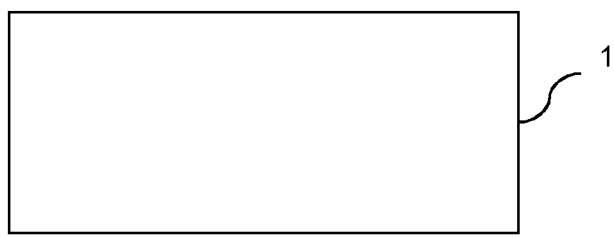
FIGS. 1A to 1E schematically illustrate the main steps of a first process for manufacturing a device according to the invention.

With reference to FIG. 1A, a support substrate 1 selected from the substrates described in detail hereinafter is provided.

Figure 1B:
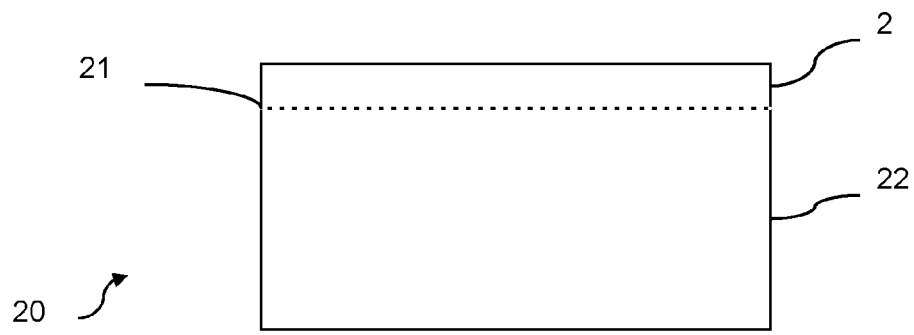

With reference to FIG. 1B, a donor substrate 20 comprising a semiconductor layer 2 is provided.

The thickness of the semiconductor layer 2 is typically between 10 nm and 10 µm.

The semiconductor layer 2 preferably comprises silicon, germanium or a nitride of one or a plurality of group III elements (for example, gallium nitride) or a group III-V alloy such as InP or AsGa.

The layer 2 may be an integral part of the donor substrate, particularly in the case of a bulk substrate.

In an alternative embodiment, the layer 2 may have been formed on a substrate 22 by epitaxy (the material of the substrate 22 being in this case suitable for the epitaxial growth of the material of the layer 2) or bonded onto the substrate 22.

Figure 1C:
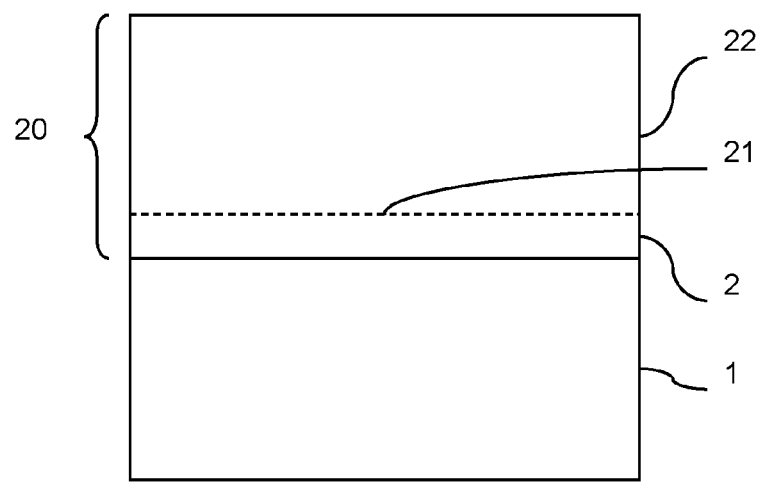

With reference to FIG. 1C, the semiconductor layer 2 is bonded on the support substrate 1.

Optionally, a layer (not illustrated here) may be formed on the semiconductor layer 2 to facilitate bonding.

This bonding layer may be produced in a material having electrical and/or thermal properties that are compatible with the intended application and enabling bonding, for example, it may consist of alumina, AlN, high electrical resistivity polycrystalline silicon, or silicon oxide provided that the thickness thereof does not exceed 50 nm.

Figure 1D:
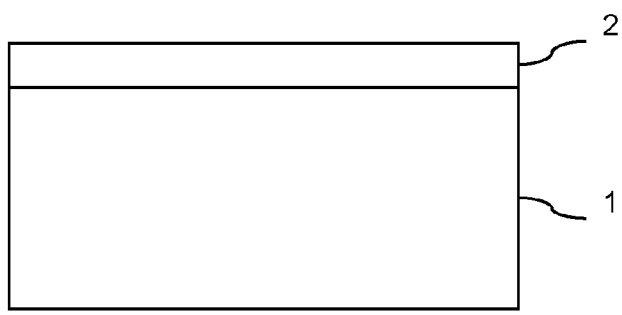

With reference to FIG. 1D, a part 22 of the donor substrate 20 is removed so as to only retain the semiconductor layer 2 on the support substrate 1.

This transfer may typically be performed by means of a SMARTCUT™ process, whereby (as illustrated in FIG. 1B) the donor substrate 20 will have previously undergone implantation of atomic species at a depth corresponding to the thickness of the layer 2 to be transferred, so as to form an embrittlement zone 21. After bonding, the application of thermal and/or mechanical stress to the embrittlement zone 21 enables the cleavage of the donor substrate 20, with a view to the detachment thereof from the rest of the structure.

Alternatively, the donor substrate may be removed by thinning via the rear face thereof, obtained by means of chemical and/or physical etching.

Figure 1E:
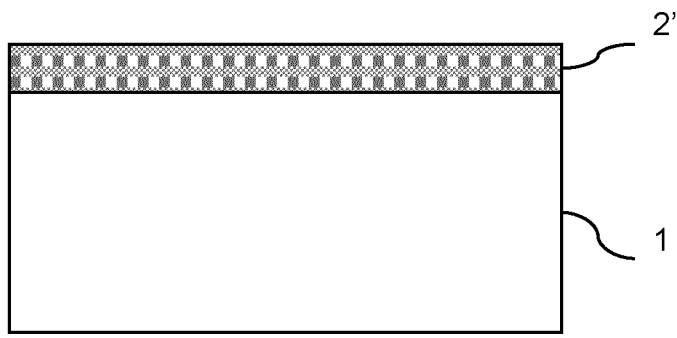

With reference to FIG. 1E, components are formed in a semiconductor layer 2' by any technique known to those skilled in the art.

Support substrates suitable for the implementation of this process and having both a good electrical resistivity and a good thermal conductivity will now be described with reference to FIGS. 2 and 3.

The support substrate 1 advantageously comprises a base layer that constitutes a mechanical support for the electronic device, and a superficial layer that is chosen so as to have both a high thermal conductivity and a high electrical resistivity.

By "superficial" is meant that the layer is located on the side of the base layer that is closest to the semiconductor layer 2.

However, in some embodiments, depending on the way of forming the superficial layer, the base layer may be encapsulated by the superficial layer. Alternatively, the superficial layer may be deposited on both sides of the base layer.

The superficial layer has a thickness of at least 5 μm.

The superficial layer has both a high thermal conductivity and a high electrical resistivity.

Preferably, the thermal conductivity of the superficial layer is of at least 30 W/mK and its electrical resistivity is of at least 3000 Ohm·cm.

The base layer has a thickness selected so as to provide a sufficient stiffness to the electronic device.

The base layer preferably has a high thermal conductivity (i.e., at least 30 W/mK) in order to allow heat dissipation through the whole support substrate.

However, since the base layer is relatively far from the semiconductor layer (from which it is separated by the at least 5 μM thick superficial layer), it is not required to present any particular electrical resistivity.

In particular, the base layer may have an electrical resistivity that is less than the electrical resistivity of the superficial layer.

In this respect, the base layer can be made of a material that is available in large diameters and that is less expensive than sapphire, while presenting a higher thermal conductivity.

By uncoupling the requirements of thermal conductivity and electrical resistivity, it is thus possible to define a support substrate that presents a high electrical resistivity in the 5 μm thick layer that is closest to the components, and a high thermal conductivity.

Therefore, it is possible to independently choose the layer that provides the electrical resistivity and the layer that provides the thermal conductivity.

Several embodiments of the support substrate are described below.

Bilayer Support Substrate

By "bilayer" is meant in the present text that the support substrate comprises at least two layers having different thermal conductivity and electrical resistivity.

The at least two layers may be made of different materials.

Figure 2:
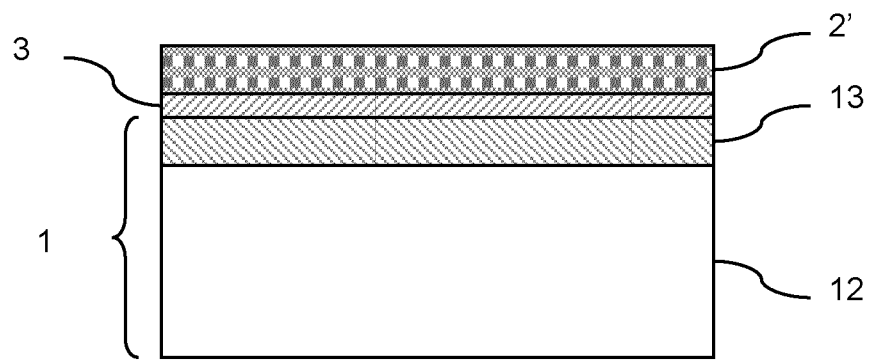
FIG. 2 is a schematic view of an embodiment of a device according to the invention.

Referring to FIG. 2, the support substrate 1 comprises a base substrate 12 made of a first material having a high thermal conductivity, coated with a superficial layer 13 made of a second material that also has a high thermal conductivity but, above all, a high electrical resistivity.

In addition, the second material preferably has a good adherence with respect to the semiconductor material of the thin layer 2.

Failing this, a bonding layer as mentioned above may be provided on the surface thereof.

This substrate 1 is manufactured by depositing a thick layer 13 (i.e., having a thickness typically greater than 10 μm and, in any event, greater than 5 μm) of the second material on a substrate 12 of the first material.

According to one preferred embodiment, the first material is silicon and the second material is AlN or amorphous diamond-like carbon (also known as DLC).

The techniques for the deposition of these materials are known to those skilled in the art.

The AlN deposition may include chemical vapor deposition (CVD) and, particularly, the high temperature chemical vapor deposition (HTCVD) process.

A further process suitable for AlN deposition is pulsed DC sputtering.

For the amorphous diamond-like carbon deposition, the following techniques may be mentioned: plasma-enhanced chemical vapor deposition (PECVD), the filtered cathodic vacuum arc (FCVA) technique, and pulsed laser deposition (PLD).

Optionally, in view of bonding the layer 2 on the thick layer 13 of the substrate 1, a fine silicon oxide layer 3 may be formed on the layer 2.

As mentioned in the previous case, the oxide layer has a thickness of less than 50 nm.

Support Substrate Having a Modified Surface Region

An alternative embodiment for obtaining a support substrate according to the invention comprises the application, to a bulk substrate, of a surface treatment giving a surface region of the substrate enhanced properties in terms of thermal conductivity and/or electrical resistivity.

In this respect, the base layer and the superficial layer may be made of the same material, but the material of the superficial layer is structurally and/or chemically and/or physically modified so that the electrical resistivity and/or the thermal conductivity of the layer is different from the electrical resistivity and/or the thermal conductivity of the base layer.

More specifically, the surface of a bulk silicon substrate may be porosified to form, on the surface, a thick porous superficial layer, i.e., having a thickness of the order of 5 μm.

The porous superficial layer is formed, for example, by means of an electrochemical reaction in an HF-type electrolyte.

Obtaining a high resistivity in the porosified region is associated with the morphology of this region.

Therefore, it is possible to ensure that a surface region of the substrate having very high electrical resistivity is formed.

Figure 3:
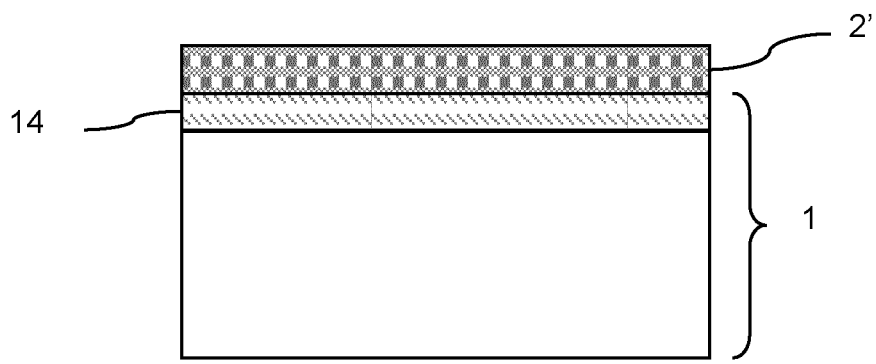
FIG. 3 is a schematic view of another embodiment of a device according to the invention.

FIG. 3 illustrates a device comprising a layer 2' of components on such a support substrate 1, wherein the region 14 of the substrate 1 situated under the layer 2' has a very high resistivity.

Moreover, since the substrate is made of silicon, it has a satisfactory thermal conductivity for the intended applications.

Second Process: Transfer of Layer Supporting Components onto the Support Substrate A second process generally consists of manufacturing the components in a semiconductor layer of a substrate referred to as the "donor substrate," and carrying out a double transfer to transfer the layer comprising the components onto the final support substrate.

Figure 4A:
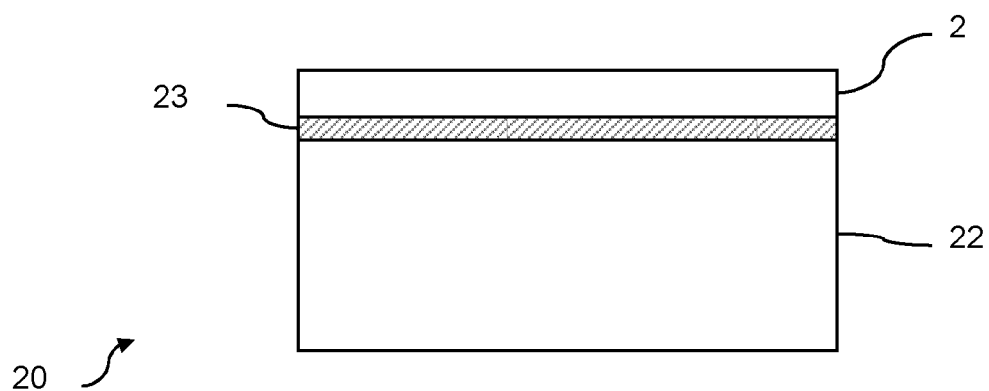
FIGS. 4A to 4F illustrate schematically the main steps of a second process for manufacturing a device according to the invention.

As illustrated in FIG. 4A, a donor substrate 20 comprising a semiconductor layer 2 is provided.

The thickness of the semiconductor layer 2 is typically between 10 nm and 10 μm.

The semiconductor layer 2 preferably comprises silicon, germanium or a nitride of one or a plurality of group III elements (for example, gallium nitride) or a group III-V alloy such as InP or AsGa.

The layer 2 may be an integral part of the donor substrate, particularly in the case of a bulk substrate.

In an alternative embodiment, the layer 2 may have been formed on a substrate 22 by epitaxy (the material of the substrate 22 being in this case suitable for the epitaxial growth of the material of the layer 2) or bonded onto the substrate 22 to form the donor substrate 20.

The material of the donor substrate 20 is suitable for withstanding the high temperatures used for the manufacture of the components.

It should also provide the whole with sufficient rigidity for handling during the various steps of the process.

According to one preferred embodiment of the invention, the donor substrate is a semiconductor on insulator (SOI)-type substrate, i.e., successively comprising a first substrate 22 acting as a mechanical substrate, an embedded layer 23, which may be a layer of silicon oxide having a thickness less than 50 nm or a layer of AlN, alumina or high-resistivity polycrystalline silicon, and the layer 2 wherein the components are to be manufactured.

This embodiment is illustrated in FIGS. 4A to 4F.

Figure 4B:
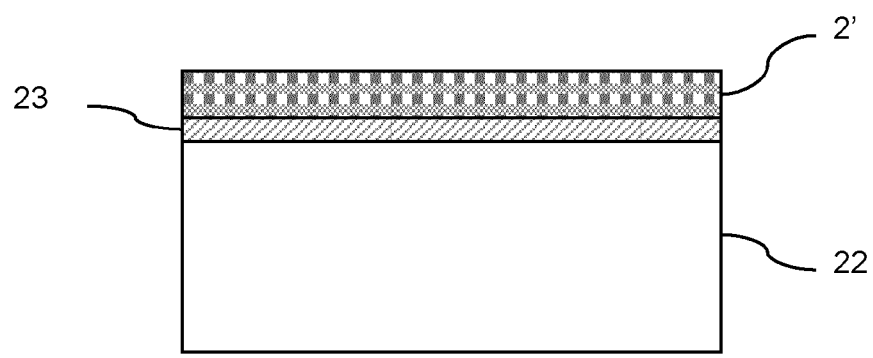

With reference to FIG. 4B, the required components are manufactured in and/or on the semiconductor layer 2, using processes known to those skilled in the art.

Figure 4C:
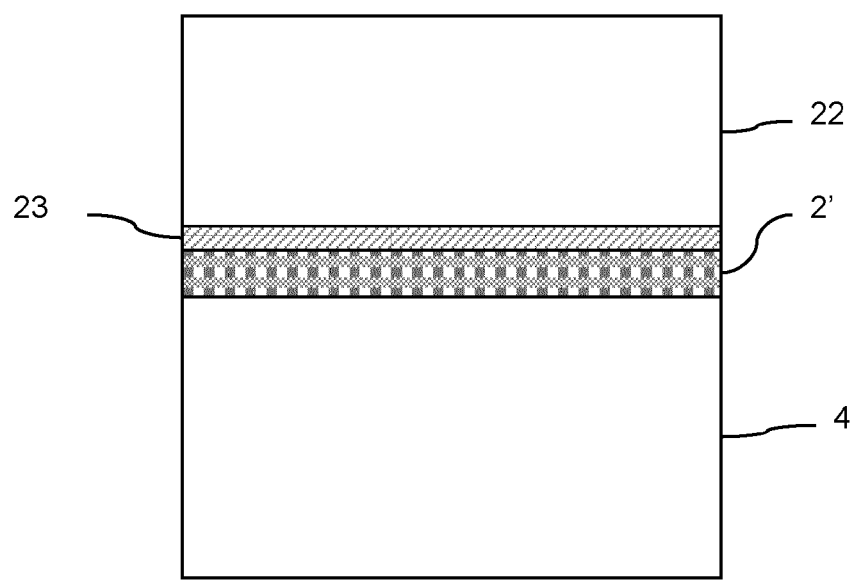

With reference to FIG. 4C, the semiconductor layer 2' comprising the components is bonded onto an intermediate substrate 4.

In this case, the components of the semiconductor layer 2' are found in an inverted position with respect to the configuration wherein they were manufactured.

Figure 4D:
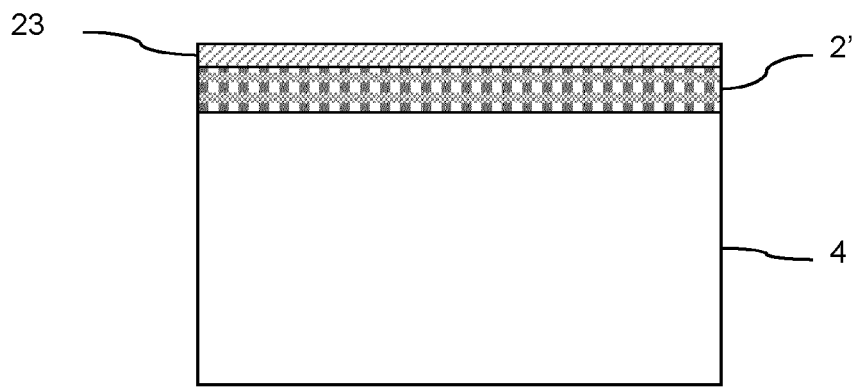

With reference to FIG. 4D, the remainder of the donor substrate 22 is removed so as only to leave, on the intermediate substrate 4, the layer 2' supporting the components coated with the layer 23.

In this donor substrate removal step, which is typically carried out by means of mechanical etching followed by chemical etching, the layer 23 acts as a barrier layer with respect to the etching agent and makes it possible to protect the layer 2'.

Figure 4E:
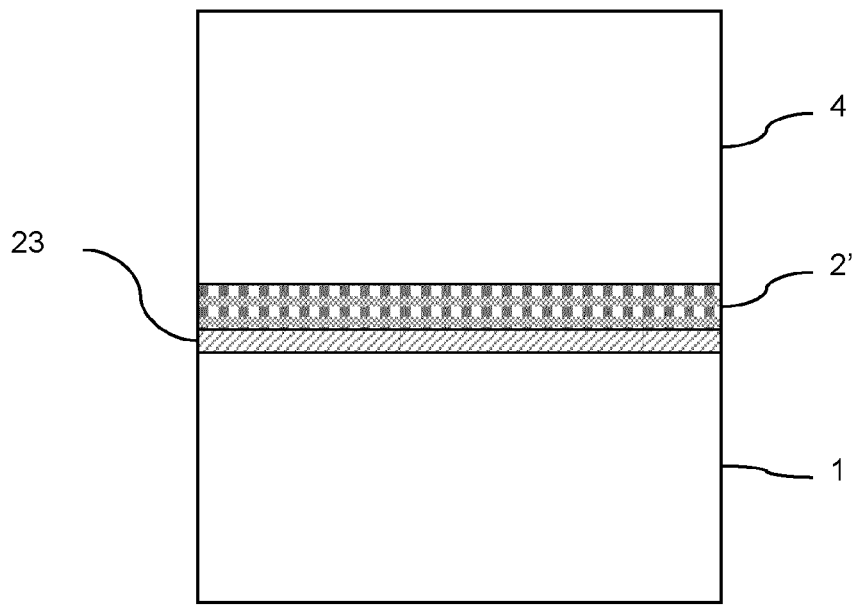

With reference to FIG. 4E, the structure obtained in the previous step is bonded onto the support substrate 1, which is the final support substrate of the device, the layer 23 being situated at the interface.

The support substrate 1 is a substrate according to the invention, i.e., having both a high electrical resistivity, at least in the 5 μm thick superficial layer, and a high thermal conductivity.

Provided that the donor substrate bonding and thinning treatments are implemented at lower temperatures than the manufacture of the components, the thermal stress applied to the support substrate is lower than for the first process.

In this way, the support substrate should withstand temperatures between 400° C. and 600° C., and the influence of the thermal expansion coefficient thereof is also lower than in the case of the first process.

Support substrates suitable for the implementation of the process will be described below.

Naturally, support substrates devised for the implementation of the first process are also suitable for use in the second process, since the thermal stress applied is lower.

In this bonding step, the layer 23 acts as a bonding layer to facilitate the adhesion of the layer 2' on the support substrate 1.

Figure 4F:
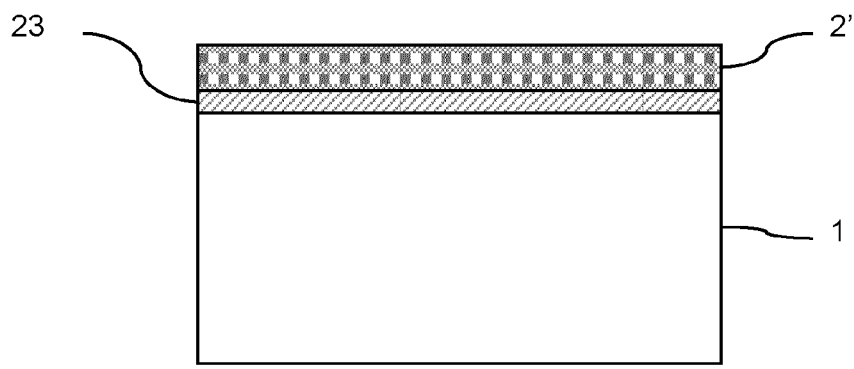

With reference to FIG. 4F, the intermediate substrate 4 is removed so as only to leave, on the support substrate 1, the layer 23, which is again embedded, and the semiconductor layer 2' comprising the components.

The components are thus restored to the configuration wherein they were manufactured.

This removal step may be implemented using any technique known to those skilled in the art.

For example, the donor substrate may be thinned via the rear face thereof, comprising material removal by means of chemical and/or physical etching (polishing).

For the implementation of this transfer process of the layer supporting the components, reference may also be made to document U.S. Pat. No. 6,911,375 describing an example of implementation thereof.

It should be noted that, if the layer 23 is a layer of silicon oxide, it is sufficiently thin so as not to form a thermal barrier in the device.

A plurality of support substrates having both a high electrical resistivity and a high thermal conductivity, suitable for use in this process, will now be described.

Support Substrate Having a Modified Surface Layer

A further embodiment, illustrated in FIG. 3, comprises the use of a bulk substrate subjected to a surface treatment giving a surface layer of the substrate enhanced properties in terms of thermal conductivity and/or electrical resistivity.

In this respect, the silicon support substrate having a porous surface layer is suitable for the implementation of this second process.

According to one alternative, an aluminium substrate is anodized or nitrided.

An anodizing treatment results in the formation of an alumina coating 14 of up to several tens of μm thick about the substrate.

Moreover, the thicker the layer formed, the higher the porosity thereof.

A nitriding treatment of the aluminium substrate gives rise to the formation of an AlN coating 14 about the substrate.

A further means of obtaining such an AlN layer consists of performing carboreduction of an alumina layer coating the substrate.

The thickness of this AlN layer is high, i.e., having a thickness typically greater than 5 μm.

A further option is that of diffusing gold over a relatively significant thickness (i.e., at least 5 μm and preferably several tens of μm) of the top face of a silicon substrate, so as to obtain a gold concentration greater than $10^{15}$ at/$cm^3$ in this layer.

Such a support substrate is obtained, for example, by depositing a gold layer on the top face of a silicon substrate, and by applying a heat treatment giving rise to the diffusion of the gold atoms in the thickness of the silicon substrate.

The heat treatment conditions, particularly the duration thereof, are determined such that gold only diffuses in a surface layer of the substrate, over a thickness of approximately 5 μm, and not throughout the thickness thereof.

The article "Semi-insulating silicon for microwave devices," D. M. Jordan et al., *Solid State Phenomena*, vols. 156-158 (2010), pp. 101-106, discloses a process for doping a silicon substrate by diffusing gold throughout the substrate but requires, for the formation of an SOI-type structure, the use of an encapsulation layer.

Device Obtained

As illustrated generally in FIGS. 1E and 4F, a wafer is thus obtained, comprising the thin layer 2' supporting the components, on a support substrate 1 having both a high electrical resistivity at least on the layer closest to the semiconductor layer supporting the components and a high thermal conductivity.

In particular, the wafer does not comprise, in the structure thereof, a thermal barrier, since the optional bonding layer arranged between the layer supporting the components and the support substrate is either made of a material not acting as a heat insulator (for example, Al, AlN or high-resistivity polycrystalline silicon), or sufficiently fine silicon oxide (i.e., having a thickness less than 50 nm) so that the heat insulating nature thereof does not impair heat dissipation within the support substrate.

FIGS. 2 and 3 illustrate various embodiments of the wafer, according to the nature of the support substrate.

The wafer advantageously has a diameter greater than 150 mm, preferably greater than 200 mm.

The wafer may then be cut along the thickness thereof in order to separate individual chips, the cutting technique being known to those skilled in the art.

The formation of the chips may also comprise thinning of the support substrate.

Indeed, the substrate is provided with a relatively significant thickness (typically of the order of 1 mm) to display sufficient rigidity during the steps for implementing the process, but the chips may function with the thinner support substrate (typically of the order of 50, or 20 μm).

Finally, it is clear that the examples given above are merely specific illustrations that are in no way limitative in respect to the fields of application of the invention.

The invention claimed is:

1. An electronic device for radiofrequency or power applications, comprising:
    a support substrate including a base layer having a thermal conductivity of at least 30 W/mK and a superficial layer having a thickness of at least 5 μm, the superficial layer having an electrical resistivity of at least 3000 Ohm·cm and thermal conductivity of at least 30 W/mK;
    a semiconductor layer supporting electronic components on the support substrate;
    a bonding layer between the support substrate and the semiconductor layer supporting the electronic components, the bonding layer comprising at least one of a silicon oxide layer having a thickness of less than 50 nm, a layer of AlN, a layer of alumina, and a layer of high-resistivity polycrystalline silicon.

2. The electronic device of claim 1, wherein the support substrate comprises a silicon base substrate.

3. The electronic device of claim 1, wherein the support substrate comprises an aluminum substrate encased with an AlN or alumina coating having a thickness greater than 5 μm.

4. The electronic device of claim 1, wherein the semiconductor layer supporting the electronic components comprises silicon, germanium, or a group III-V alloy.

5. The electronic device of claim 1, wherein the electronic device comprises a wafer having a diameter greater than or equal to 150 mm.

6. The electronic device of claim 1, wherein the electronic device is a chip.

7. The electronic device of claim 1, wherein the superficial layer is between the base layer and the semiconductor layer.

8. A method for manufacturing a device for radiofrequency or power applications, the device having a layer supporting electronic components on a support substrate, the method comprising the following successive steps:
    a) formation of a structure comprising a semiconductor layer bonded on the support substrate by way of a bonding layer formed on the semiconductor layer, the bonding layer comprising at least one of a silicon oxide layer having a thickness of less than 50 nm, a layer of AlN, a layer of alumina, and a layer of high-resistivity polycrystalline silicon; and
    b) manufacture of the electronic components in the semiconductor layer;
    wherein, during step (a), the support substrate comprises a base layer having a thermal conductivity of at least 30 W/mK and a superficial layer having a thickness of at least 5 μm, the superficial layer having an electrical resistivity of at least 3000 Ohm·cm and thermal conductivity of at least 30 W/mK.

9. The method of claim 8, wherein the support substrate comprises a silicon base substrate.

10. A method for manufacturing a device for radiofrequency or power applications, the device having a layer supporting electronic components on a support substrate, the method comprising the following successive steps:
    a) manufacturing the electronic components in a semiconductor layer of a donor substrate;
    b) bonding the semiconductor layer supporting the electronic components on an intermediate substrate;
    c) removing a remainder of the donor substrate and transferring the semiconductor layer supporting the components onto the intermediate substrate;
    d) bonding of the semiconductor layer supporting the electronic components on the support substrate; and
    e) removing the intermediate substrate;
    wherein a bonding layer is present at an interface between the support substrate and the semiconductor layer supporting the electronic components, the bonding layer selected from the group consisting of a silicon oxide layer having a thickness of less than 50 nm, a layer of AlN, a layer of alumina, and a layer of high-resistivity polycrystalline silicon, and wherein, in step (d), a support substrate is used comprising a base layer having a thermal conductivity of at least 30 W/mK and a superficial layer having a thickness of at least 5 μm, the superficial layer having an electrical resistivity of at least 3000 Ohm·cm and thermal conductivity of at least 30 W/mK.

11. The method of claim 10, wherein the support substrate comprises a silicon base substrate.

* * * * *